United States Patent [19]
Wegmann et al.

[11] Patent Number: 5,159,234
[45] Date of Patent: Oct. 27, 1992

[54] ELECTRON BEAM GENERATOR AND EMISSION CATHODE

[75] Inventors: Urs Wegmann, Oberschan; Albert Koller, Azmoos; Hubert Mannhart, Sargans, all of Switzerland

[73] Assignee: Balzers Aktiengesellschaft, Balzers, Liechtenstein

[21] Appl. No.: 635,682

[22] Filed: Dec. 27, 1990

[30] Foreign Application Priority Data

Jan. 10, 1990 [DE] Fed. Rep. of Germany ....... 4000573

[51] Int. Cl.[5] ............................................. H01J 1/00
[52] U.S. Cl. ..................................... 313/237; 313/337; 313/346 R; 313/270
[58] Field of Search ........... 313/270, 237, 337, 346 R, 313/346 DC; 250/423

[56] References Cited

U.S. PATENT DOCUMENTS 4,441,048  4/1984  Takaoka et al. ................. 313/346 R

FOREIGN PATENT DOCUMENTS 1589814  5/1970  Fed. Rep. of Germany.
2302938  11/1978  Fed. Rep. of Germany.

Primary Examiner—Donald J. Yusko
Assistant Examiner—Michael Horabik
Attorney, Agent, or Firm—Notaro & Michalos

[57] ABSTRACT

An electron beam generator having an electron emission cathode adopted to be rapidly mounted to an installation, has an electronically insulating support body that is clamped on one side to a metal contact body having a large surface area. At the other side of the electrically insulating support body, a quick release device is arranged in order to rapidly mount and dismount the generator to an installation.

24 Claims, 4 Drawing Sheets

ELECTRON BEAM GENERATOR AND EMISSION CATHODE

FIELD AND BACKGROUND OF THE INVENTION

The present invention relates to an electron beam generator having a heated electron emission cathode, to an electron beam evaporator device having such a generator, and to a vacuum treatment installation having an electron beam evaporator and an electron beam generator.

DESCRIPTION OF THE PRIOR ART

An electron beam generator is used in vacuum vaporization installations for the generation of an electron beam which, after having been generated, is deflected by electron-optical means onto a crucible in order to vaporize material placed in the crucible. The generator includes an electron emission cathode which is heated either directly by joulean heat or indirectly e.g. in that it is mounted in the immediate area of a heating member. In both cases a negative high voltage potential is usually applied to the electron emission cathode and e.g. a ground potential is applied to an anode located directly over the cathode. Similarly, the ground potential is applied to parts of the installation onto which such a generator is mounted. Thus, high voltages exist over such an electron beam generator such that a corresponding insulation of part of the installation between the mounting parts of the cathode and the mounting parts for the generator, must be used.

A second demand which must be met for such generators is that the electron emission cathode must be extremely precisely positioned relative to the part of the installation to which it is mounted, such that electrons which are emitted from the cathode, after passing the anode of the generator, enter subsequent electron-optical units in a reproducibly precise fashion. This must also take the high temperature gradient produced at the generator into consideration.

SUMMARY OF THE INVENTION

It is a general object of the invention to provide an electron beam generator which has an extremely simple and rugged design and at which the reproducibly precise mounting of the cathode and of other electron-optical parts is guaranteed in a simple and reliable fashion.

A further object is to provide an electron beam generator which has an electrically insulating supporting body which, on one side, is adapted for mounting the generator in an installation, and on the other side, is adapted for receipt of the electron emission cathode. The supporting body includes mechanical position reference abutment surfaces for at least the electron emission cathode and further electron-optical parts of the generator, such that an exchanging of cathodes is made simple and reproducible, and also a mounting or demounting of the entire generator, e.g., for cleaning purposes, is simple and reproducibly precise.

Still a further object is to provide a generator where clearly defined and reproducible temperature conditions are provided and where the use of the supporting body as a mechanical reference allows for differing thermal expansions of the insulators and the metal parts, without any influence on the electron-optical conditions.

A further object is to provide a generator in which a supporting body of $Al_2O_3$ is used.

Still a further object is to provide a generator having a structurally simple design so that a defined reproducible heat conduction is guaranteed between the part of the supporting body at the cathode and metal parts of the installation to which the generator is mounted.

Yet a further object is to provide a generator wherein the supporting body is clamped at one side to a metal contact body over a large surface area so that the necessary heat conducting conditions between the insulating supporting body and the metal contact body, are met.

A further object is to provide an electron beam generator which can be mounted and demounted, in a simple fashion, to a complete vaporizer installation including for instance, electron-optics and crucibles, so that if it is necessary to interrupt a vapor deposition process, for example, when the electron emission cathode has been consumed, this can be done quickly.

Yet a further object is to provide a generator which has at least one quick release device for a rapid mounting of the generator to the supporting body.

Still a further object is to provide a generator in which the quick release device includes at least one projecting bolt having a radial conical bore.

A further object is to provide a quick release device for connecting a part of an installation to an electron beam generator, which part includes a receiving bore for a bolt having a radial conical bore. A radial clamping screw including a conical tip is adapted to be driven into the bore. The axis of the screw is offset relative to the axis of the bore in the bolt when the bolt is inserted and prior to driving the screw in, so as to clamp the generator to the part when the screw is driven in, via the conical bore.

Yet a further object is to provide a quick release device which allows an electron beam generator to be clamped, via a quick release device, to a part of the installation so that the generator is in an unequivocally defined position, and to guarantee a reproducible heat conducting effect by means of this clamping, between the generator and the mentioned part of the installation, to which the generator is clamped.

A further object is to provide a generator in which the electron emission cathode is a cathode which is heated directly by joulean heat or heated indirectly, preferably a cathode assembled as a structural unit, having heating members.

Yet a further object is to provide a generator having two metal cathode connection supporting blocks arranged to locate and fix the cathode despite alternating high thermal loading.

A still further object is to provide a generator in which the cathode is mounted relative to an emission surface in a point contact manner such that it can thermally expand freely without distortion. In the preferred embodiment, according to which the cathode is designed as a cathode heated by joulean heat or as an indirectly heated cathode, two substantially parallel supporting terminals, preferably also for receiving the heating current, are provided and project on the same side relative to the cathode emission surface. The cathode is supported and held mechanically by these two terminals to allow free thermal expansion as set forth above, and preferably also to receive electric power for the cathode.

A further object is to provide a generator in which each of the cathode terminal blocks includes a locating device for one of the cathode terminals.

A still further object is to provide a generator which guarantees a faultless exchange of cathodes that must all be mounted in only one single, specific position and where the cathode terminals are designed differently at the cathode side and in the same way the locating devices are designed differently at the generator side such that a respective cathode terminal can be inserted merely into one of the locating devices such that a faultless inserting of a cathode is guaranteed. This insures that a cathode can be mounted only in one single predeterminated position so that it is impossible to mount the cathode with the wrong surface facing the direction of emission.

A further object is to provide a generator in which not only a surface-wise correct mounting of the cathode as set forth above is made possible but also a mounting in a precisely set position and where an abutment device is located at least at one of the locating devices such that the emission cathode must be brought into the abutting position and then must be fastened there.

It has been mentioned earlier that high voltage values are usually present at such electron beam generators between the cathode and parts of the installation to which the generator is mounted. Accordingly, it is of the utmost importance that the insulation between the cathode and the mentioned parts of the installation, have permanent high surface resistance. This must be insured despite the great many applications for such generators. It may not be self-evident, for example, when thinking of vacuum vapor deposition installations, that often conductive material is vaporized from the crucible or pot, which quite obviously can be deposited on the insulating parts of the beam generator. The cathode is also vaporized during its operation in that it is exposed to a bombardment of ions. Thus a second source of material that can impair the insulation stems from the cathode at the generator. The two mentioned factors which impair the insulation have in common that vaporized conductive material comes in a quite predominant amount regarding the generator from that side against which the emission surface of the cathode is facing, or from the side toward which the electron beam is generated.

Accordingly, it is a further object of the invention to protect the surface insulation from impairment due to vaporized cathode material and process vapor in that the supporting body is covered by overhangs and a preferably circular recess for increasing the length of the path of creeping current between the two sides of the supporting body is also provided.

A further object is to provide a generator having cathode supporting blocks as set forth above which must be separated from each other for heating current supply to the cathodes, i.e. where a gap is provided between the parts and wherein the impairment of the surface insulation is prevented in that the cathode supporting blocks overhang the supporting body and are designed to extend in a complementary form without contacting each other so that the supporting body is completely concealed by the cathode supporting blocks from the direction of the other side of the supporting body, i.e. from that side on which the beam is generated.

A further object is to provide a generator in which only the cathode supporting blocks are acted upon by or exposed to vapor from the cathode or the production process which, as long as their electric separation is secured, remains without any influence regarding the function of the generator.

In case of directly or indirectly heated electron emission cathodes, a high heating current which can amount to several amps must flow through the cathode or heating device. Such a current generates a considerable magnetic field which can strongly influence the emission characteristics of the cathode and also the propagation of the electrons. When it is taken into consideration that there is an advantage for directly heated electron emission cathodes and also for indirectly heated cathodes to be designed so that their structures are closed in themselves since the performance of the emission can be adjusted quite simply by changes in the heating current, it becomes obvious that this magnetic field at high currents cannot be neglected. In the case of an AC-power supply, or also merely upon changes in a DC-heating current including an AC-magnetic field, just as for the DC-portion of an AC-supply, the magnetic fields can be extremely disturbing regarding the desired emission and propagation characteristics of the generator. In order to counteract this situation it is an object of the invention to provide a generator structured such that power supply conductors at the generator for a cathode heating current intersect an emission surface of the cathode, at a spatial plane defined by this surface, specifically a planar plane at an as large as possible distance, i.e. to lead the power supply lines or bars to the heated emission cathode such that when viewing the emission surface of the cathode, these power supply lines initially pass through a plane defined by the emission surface initially at a large distance from this emission surface. As long as the power supply lines are located below the plane defined by the emission surface it is possible to shunt the magnetic fields generated in these power supply lines largely by metal shielding or control electrodes.

A still further object is to provide a generator wherein the supporting body forms a structure in the shape of a substantially parallelepiped block and in that the emission surface of the cathode is located substantially in one of the corners of the surfaces of the block, and wherein heating power supply lines for the cathode are located at a side surface of the block which does not form the mentioned corner, i.e. when the emission surface of the cathode is located substantially at the one corner of one of the surfaces of the parallelepiped block where the current supply lines for this cathode are located commensurate with the above statement at one side surface of the parallelepiped block which does not form this corner, i.e. along the diagonal line of this parallelepiped block at a large distance from the mentioned emission surface.

Yet a further object is to provide a generator wherein at least one electron-optical control electrode is arranged over the emission cathode which is preferably screwed on such that this part which is predominantly exposed to ion bombardment can easily be exchanged without any demounting of further parts of the generator.

Thereby, a desired potential is applied to the control electrode which electrode is also used for further purposes, namely to shunt magnetic fields over the emission surface of the cathode and, to secure an as good as possible heat dissipation.

Hence, it is a further object of the invention to provide an electron beam generator in which the control electrode is designed as a sandwich structure having a first layer which faces the electrode and a magnetically excellently conducting second layer facing away from the cathode surface, to act in two respects, namely as a heat shield or ion bombardment shield, and as a magnetic shield apart from its possible control function. In order to increase the heat shield effect the control electrode is structured preferably with an interstice between the layers.

A still further object is to provide a generator having an anode above the cathode emission surface which anode is mounted at the contact body via metal connectors whereby the anode to be provided at the emission side of the cathode is not mounted to the supporting body but rather via a metal connector at the contact body which as is mentioned above is located at the side of the cathode facing away from the side of the supporting body. This guarantees an optimal direct metal heat conducting path from the anode over the mentioned contact body to the part of the installation to which the generator is mounted. Furthermore, the anode is again demountable without having to change anything at the mounting of the cathode.

A further object is to provide a generator wherein, in order to further reduce the influencing of magnetic fields caused by the heating current, an area including a cathode emission surface is separated by a screening from areas having heating current conductors which screening is located between areas where the heating current conductors extend and the area of the emission surface of the cathode.

A still further object is to provide a generator which is of a simple structure and is easy to maintain and wherein the supporting body with a contact body and/or the supporting body with cathode holding blocks and/or the supporting body or one of the cathode holding blocks with the control electrode and/or the cathode holding blocks with the electron emission cathode, are mountable in a form-locked fashion only in predetermined positions, preferably mountable by screw connectors such that all important parts of the generator are mounted with as few screws as possible and which are designed relative to each other so that they are mountable in a form-locked manner and against abutments only in predetermined positions relative to each other. Accordingly, the cathode holding blocks are mountable at the supporting body only in predetermined positions and by screws at the cathode holding blocks. The emission cathode is mounted by screwed clamping members only in a predetermined position. The control electrode, relative to the cathode emission surface, is also mounted by means of screws and in a predetermined position, as is the anode with a diaphragm for the passing of the electron beam. Fastening by screws is made without a threaded engagement in the supporting body. The parts are screwed together over the supporting body, and they are clamped relative to each other.

A further object is to provide an electron beam evaporator device comprising a beam generator structured as set forth above, which device is easy to maintain regarding the electron optical beam generating members and necessitates as few interruptions of the operation as possible, for maintenance work due to the fact that when maintenance work must be performed on the beam generator, it need not be worked on at the installation but rather can be replaced by a repaired generator. With such a design, not only the vaporizing installation together with such generator can be operated with much smaller time spans of interruptions of operation, i.e. less down time, but rather the entire vacuum treatment installation has less down time if one considers that the electron beam generator is the "heart" of such an installation. If there is a longer stoppage, the installation suffers if no measures are taken, such as by the inventive generator, to reduce such stoppage and its duration to a minimum. In accordance with the invention an extremely easy exchangeability of the parts most subject to wear, such as the anode and control electrode or cathode, or even the entire generator, is made possible.

BRIEF DESCRIPTION CF THE DRAWINGS

In the drawings:

FIG. 7b is a top plan view of FIG. 7a.

DESCRIPTION OF THE PREFERRED EMBODIMENTS

Figure 1A:
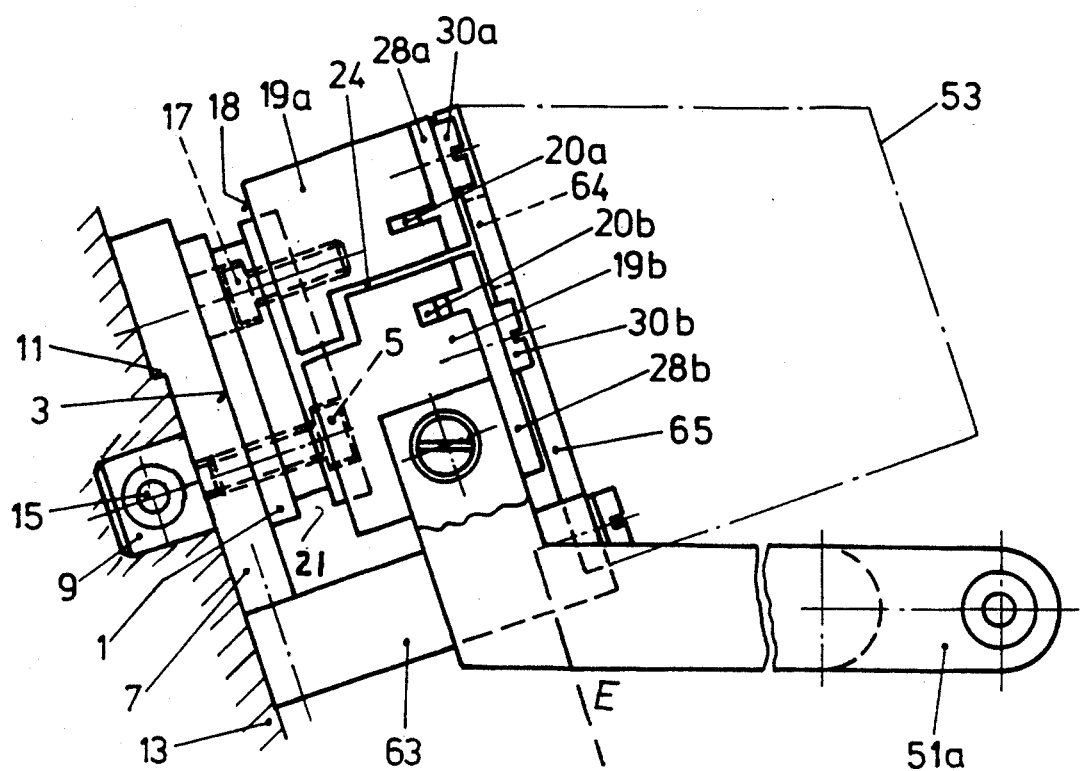
FIG. 1a is a side view of a generator in accordance with the invention mounted on a schematically shown part of an installation.

The inventive beam generator shown in FIG. 1a, is assembled around an insulating supporting or base body 1 having substantially the shape of a parallelepiped and made for instance of aluminum oxide. A metal contact body or interface block 7 is clamped by means of e.g. four fastener screws 5 on one planar side 3 of the base body whereby the planar side 3 of the base body 1 is clamped in the same fashion to a planar surface of the block 7. The thread for the screws 5 is not located in the base body 1, but e.g. in the interface block 7. This guarantees a defined reproducible heat transfer between the base body 1 and the interface block 7. A quick-release clamping bolt 9 projects out from the side of the interface block 7 facing away from the base body 1.

An abutment step 11 is formed in the interface block 7. By means of this abutment step 11 the interface block 7 is mounted to a corresponding abutment on a part of the installation illustrated schematically at 13, for instance, an electron beam control unit for controlling the path of the beam and/or for focussing the beam.

Figure 1B:
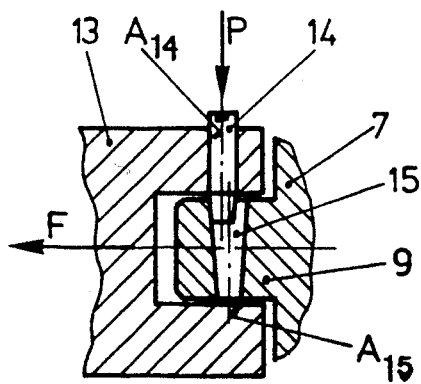
FIG. 1b is a sectional view of a quick release device therein.

The quick release clamping bolt 9 is inserted into a corresponding (not specifically illustrated) cylinder bore in the installation part 13. A clamping bore 15 which narrows down conically is arranged radially in the quick release clamping bolt 9 and extends preferably completely therethrough. A clamping screw 14 is in turn arranged at the installation part 13 such as illustrated in FIG. 1b and projects radially into the clamping bore 15. The axis $A_{14}$ of this screw 14 is offset relative to the axis $A_{15}$ of the clamping bore 15 in the direction of insertion of the quick release clamping bolt 9 such that due to the screwing-in P of the conically extending tip of the screw into the clamping bore 15, the block 7 is clamped in the direction F, due to the wedge forces against the planar machined contact surface of the installation part 13.

Figure 2:
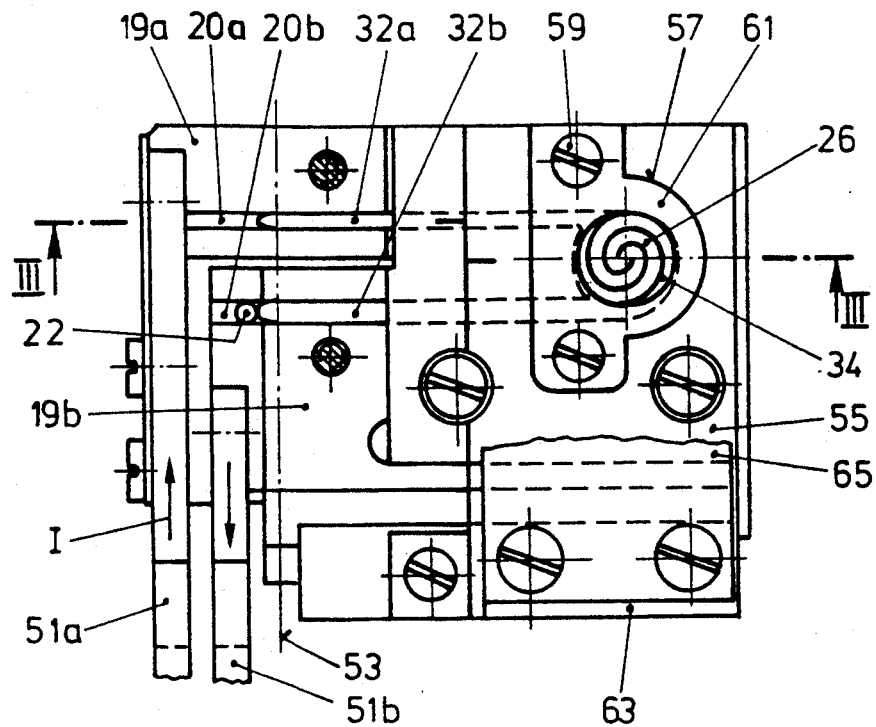
FIG. 2 is a top view of the inventive generator of FIG. 1a where the anode plate is partly cut away.

By means of cathode holding screws 17 of which only one is illustrated in FIG. 1a, two cathode terminal supports 19a and 19b having a thread for the screws 17 are screwed on, at the side of the base body 1 facing away from the interface block 7. As illustrated in FIG. 2, respective receiving grooves 20a and 20b, are formed in the respective cathode terminal supports 19a and 19b, whereby one of the two grooves, e.g., the groove 20b, is somewhat broader than the other groove 20a and both run parallel to each other. A stop bolt 22 projects into groove 20b as illustrated in FIG. 2. The two cathode terminal supports 19a and 19b are designed, as illustrated in FIG. 1, so that they overhang on all sides by an edge 18, over the substantially planar side of the base body 1 facing away from the interface block 7. Further the two cathode terminal supports 19a and 19b extend next to each other as illustrated in FIG. 1a, and they are separated by a labyrinth gap 24. Accordingly, if seen from the side which includes the grooves 20a and 20b where an emission cathode is mounted, no visual contact with the insulating base body 1 exists. In this way, substantially no vaporizing cathode material or material being vaporized by the electron beam for the process can deposit on the insulating base body 1. Thus the life span of its surface is substantially increased. A groove 21 shown in FIG. 3, extends around the base body 1. In this way the path of creeping current along the base body 1 is made to be much longer.

Figure 3:
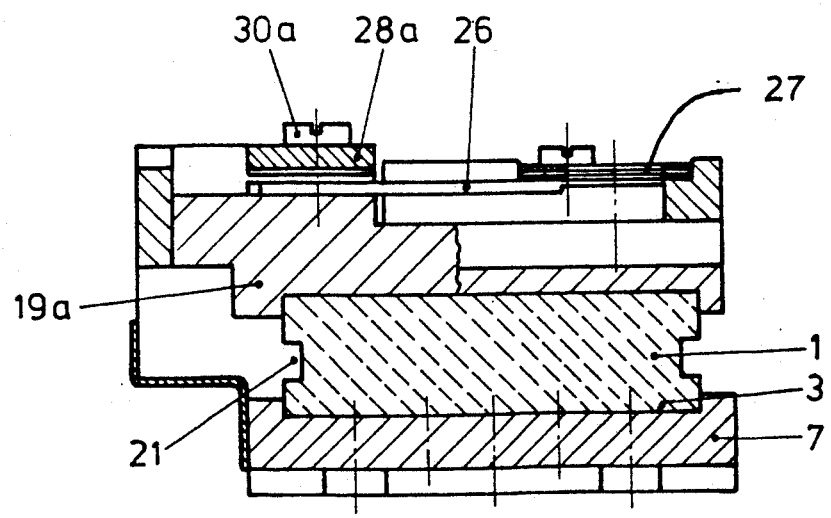
FIG. 3 is a sectional view of the inventive generator of FIG. 2 taken along line III—III of FIG. 2.
Figure 4:
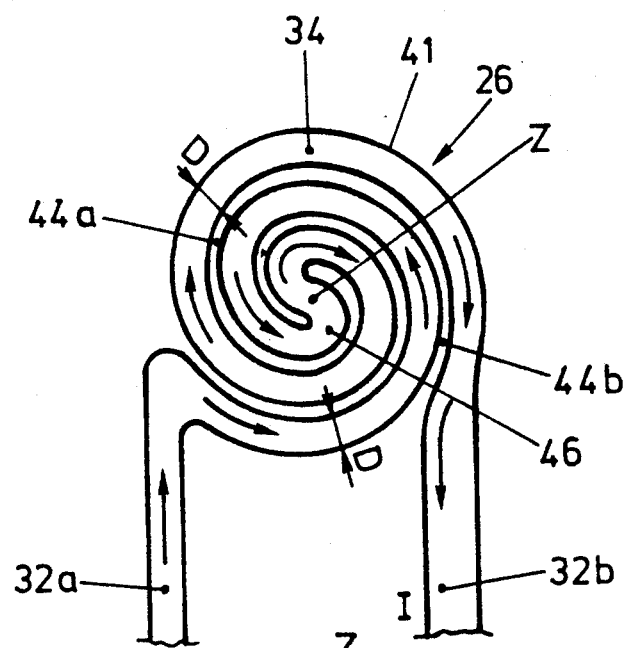
FIGS. 4 and 5 are plan views of directly heated electron emission cathodes for the inventive generator.

As specifically illustrated in FIG. 2, and in connection with FIG. 3, the respective terminals 32a and 32b of an electron emission cathode 26 are inserted into the two cathode terminal grooves 20a and 20b. One terminal of the cathode 26 is of a larger width than the other one such that the cathode can be inserted into the grooves in only one defined position and additionally exactly into the desired position due to abutment with stop bolt 22. After the two cathode terminals have been inserted the cathode 26 is clamped by means of clamping plates 28a and 28b via screws 30a and 30b at the corresponding terminal supports 19a and 19b. Such as illustrated in FIG. 3, the base body 1 forms already for the parts 7, 19 an exact positioning or locating reference by means of abutment surfaces.

FIGS. 2 and 3 disclose further that the emission cathode 26 is mounted exclusively at its terminals and the electron emission surface 34 is otherwise freely exposed. This allows the electron emission cathode to expand thermally in all directions without producing mechanical stresses and accordingly distortions thereof.

Preferably electron emission cathodes are used such as illustrated in FIGS. 4 to 7b. According to FIG. 4 a directly heated electron emission cathode 26 includes a emission body 41 having a planar shape and defining a substantially circular emission surface 34. A helical slot arrangement in the body 1 includes a first slot 44a extending from the cathode terminal 32a spirally toward the center Z. A second slot 44b is located beside the first slot 44a and extends spirally toward the center Z. The integrity of the emission body 41 is provided in the center Z by a bridge portion 46 remaining there such that a bifilar power conductor arrangement I is realized by the two spiral slots 44a and 44b through which, such as indicated by arrows, a heating current is driven. The width of the slots 44a and 44b, is less than the width D of the current conductor I and the local production of heat and accordingly the distribution of the emission of electrons along the emission surface defined by the emission body 41 can be influenced by a local, continuous or discontinuous changing of the cross-section of the current conductor. Thereby, the width D of the current conductor is preferably larger than the thickness of the plate like body 41.

Figure 5:
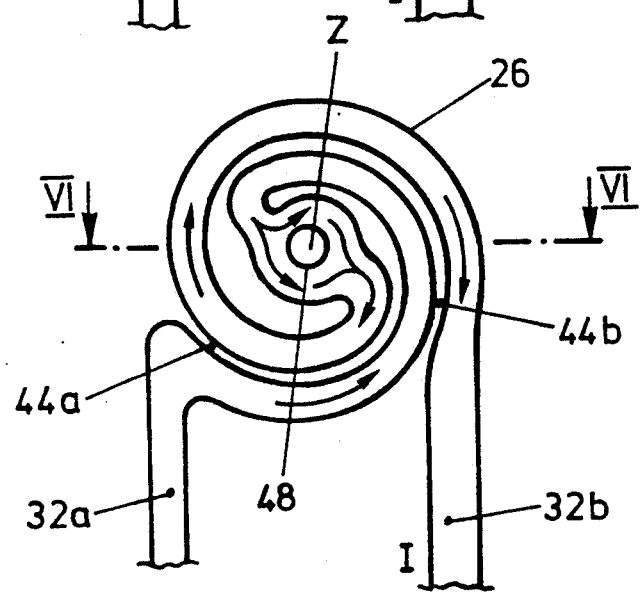

A further preferred embodiment of the directly heated electron emission cathode 26 used on the electron beam generator 1, is illustrated in FIG. 5. Basically, its structure is similar to the structure of the cathode illustrated in FIG. 4 but includes in its center Z a preferably circular through opening 48 for preventing an erosion due to bombardment by ions.

Figure 6A:
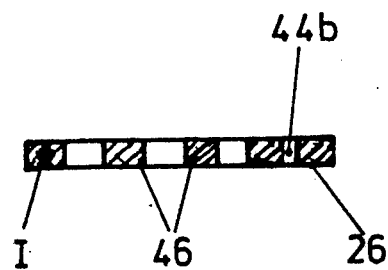
FIG. 6a is a sectional view of a cathode according to FIG. 5, taken along line VI—VI and having a planar design.
Figure 6B:
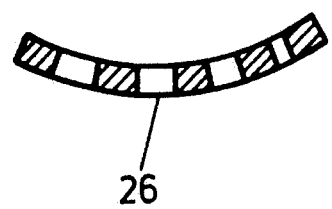
FIG. 6b is a view similar to FIG. 6a but with a domed design.

In FIG. 6a a cross-sectional illustration along line VI—VI of FIG. 5 through a preferably used flat electron emission cathode 26 is depicted and FIG. 6b is a cross-sectional illustration of a emission electrode which is not planar but rather formed into a spatial plane, such as by pressing the initially planar electrode.

Figure 7A:
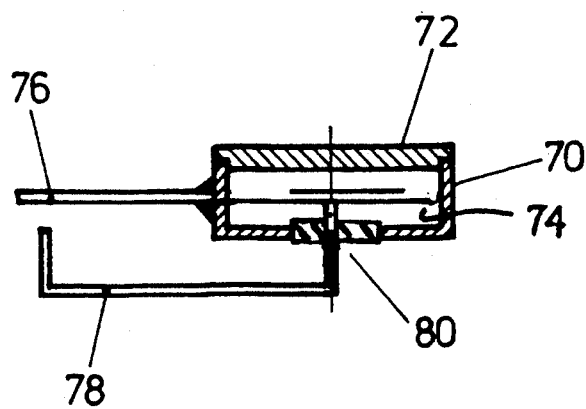
FIG. 7a is a sectional view of an inventive indirectly heated emission cathode arrangement.
Figure 7B:
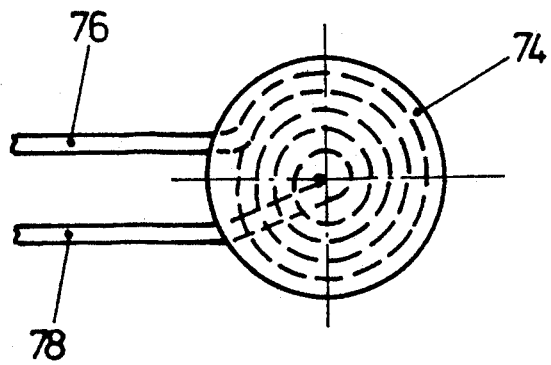

FIG. 7 illustrates an indirectly heated cathode which includes a pot 70 which is closed at one side by a removable lid 72 acting as electron emission surface. The lid 72 acting as emission surface is made of the desired cathode material, possibly different from that of the other parts of the pot 70. A heating spiral 74 having power supply lines 76 and 78, is located in the pot 70 directly adjacent the lid. The power supply line 76 is connected galvanically to the lid 72 so as to place the emission surface at the cathode potential. The second power supply line 78 is insulated and led for instance by means of a ceramic bushing 80 out of the pot 70. In order to secure an excellent heat conducting effect between the heating spiral 74 and the emission surface 72, the pot 70 is structured to be hermetically sealed and has a heat conducting gas encapsulated therein. This is particularly needed in vacuum installations. The indirectly heated electrode illustrated schematically in FIG. 7 is mounted to the inventive beam generator exactly as the previously described, directly heated cathode.

Returning to FIGS. 1a–3, in order to supply heating current I, power supply bars 51a and 51b, are screwed onto the cathode terminal supports, and specifically regarding the cathode terminal supports 19a and 19b, perpendicularly to the grooves 20a and 20b and at the side of the generator remote from the emission surface of the cathode 26. Sections of the power supply bars 51a and 51b which project over the plane E of the emission surface 34 (see FIG. 1) of the emission cathode 26 are as far as possible from the surface 34. The spatial areas with the supply bars 51a and 51b and the emission cathode 26, are separated from each other by a screening plate 53. Such a screening plate 53 as illustrated in FIGS. 1a and 2 by dash-dotted lines, is mounted to the anode potential for instance by means of a clamping screw.

Furthermore, as be seen in FIG. 2, a control electrode supporting plate 55 is mounted and electrically connected to one of the two cathode terminal supports 19a or 19b, as illustrated by the support 19b, with supporting plate 55 operated at the same potential as the electron emission cathode. It is thereby effected that the supporting plate 55 contacts only one of the two cathode terminal supports 19a or 19b in order not to short circuit the heating current by the cathode 26. A recess 57 is made into the supporting plate 55 in which an easily replaceable diaphragm insert 61 is fixed by means of screws 59 in a form-locked manner and thus is galvanically connected thereto and which forms the control electrode. It is thereby quite simply possible to mount the control electrode, with a corresponding mounting of the supporting plate 55 or of the insert 61 insulated from the potential of the electron emission cathode 26 and to set it to a desired potential.

FIG. 2 illustrates further, together when FIG. 1a, that a spacer block 63 is screwed to the interface block 7 and supports an anode plate 65 having a diaphragm opening 64 which is centered to the cathode emission surface.

All described parts of the inventive beam generator are mountable to the base body 1 in defined positions in a formlocked manner and are easily replaceable by a loosening of screw connections. The control electrode insert 61 is easy removable and designed as a part which is subject to wear such as mentioned earlier. Specifically the diaphragm insert 61 acts as a magnetic screen of the electron emission cathode 26 and as a heat shield.

Additionally, the diaphragm insert 61 is made as a sandwich structure, e.g. of Mo and Fe Co. While the Mo layer acts as protection against radiation or as a heat shield, the Fe Co layer forms a magnetic "shunt" over the electron emission cathode 26 in order to prevent a magnetic stray field influence on the shaping of the beam. Between the two layers a interstice 27 is preferably provided, having the effect of improving the effectiveness as a heat shield such as illustrated in FIG. 3.

The spacer 63 takes care of good heat dissipation from the anode directly to the interface block 7. The heat dissipation between the inventive beam generator and the installation part 13 proceeds via the contact surface which is pre-tensioned by the quick release clamping bolt 9.

The described inventive electron beam generator is of a small and compact structure and is with the illustrated quick release fastening device or another easy disengageable mounting possibility extremely suitable to be rapidly replaced e.g. for maintenance work without a long shut-down of the installation.

While there are shown and described present preferred embodiments of the invention, it is to be distinctly understood that the invention is not limited thereto, but may be otherwise variously embodied and practiced within the scope of the following claims.

We claim:

1. An electron beam generator arrangement having a heated electron emission cathode, and comprising an electrically insulating supporting body which, at one side thereof is adapted for mounting to an installation, and at another side thereof is adapted for receipt of the electron emission cathode, the arrangement including a plurality of abutment surfaces acting as mechanical position references for at least said electron emission cathode and for at least one additional part of the generator arrangement, said supporting body being clamped at the one side onto a metal contact body over a large surface area of the contact body and the supporting body.

2. An electron beam generator arrangement having a heated electron emission cathode, and comprising an electrically insulating supporting body which, at one side thereof is adapted for mounting to an installation, and at another side thereof is adapted for receipt of the electron emission cathode, the arrangement including a plurality of abutment surfaces acting as mechanical position references for at least said electron emission cathode and for at least one additional part of the generator arrangement, the arrangement including at least one quick release device for a rapid mounting of the generator arrangement, located at the one side of said supporting body, said quick release device comprising at least one projecting bolt having a radial conical bore, the installation having a receiving bore for said bolt, a radial clamping screw including a conical tip adapted to be driven into said bore, whereby the axis of said screw is offset relative to the axis of the bore in said bolt when the bolt is inserted and prior to a driving in of the screw so as to clamp the generator arrangement at the installation upon a driving in of the screw via the conical bore at the bolt.

3. An electron beam generator arrangement having a heated electron emission cathode, and comprising an electrically insulating supporting body which, at one side thereof is adapted for mounting to an installation, and at another side thereof is adapted for receipt of the electron emission cathode, the arrangement including a plurality of abutment surfaces acting as mechanical position references for at least said electron emission cathode and for at least one additional part of the generator arrangement, the arrangement including two metal cathode connection supporting blocks connected to the supporting body at said other side thereof.

4. An electron beam generator arrangement having a heated electron emission cathode, and comprising an electrically insulating supporting body which, at one side thereof is adapted for mounting to an installation, and at another side thereof is adapted for receipt of the electron emission cathode, the arrangement including a plurality of abutment surfaces acting as mechanical position references for at least said electron emission cathode and for at least one additional part of the generator arrangement, the supporting body being substantially in the shape of a parallelpiped, the cathode having an emission surface located substantially at one corner of a surface of said parallelpiped, and wherein heating power supply lines for the cathode are located at a side surface of said parallelpiped which does not form said one corner.

5. An electron beam generator arrangement having a heated electron emission cathode, and comprising an electrically insulating supporting body which, at one side thereof is adapted for mounting to an installation, and at another side thereof is adapted for receipt of the electron emission cathode, the arrangement including a plurality of abutment surfaces acting as mechanical position references for at least said electron emission cathode and for at least one additional part of the generator arrangement, wherein the supporting body is mounted to the installation and to the additional part by means of screwing with threads in the installation and additional part and no threads being in the supporting body.

6. The arrangement of claim 1, 2, 3, 4 or 5, wherein said supporting body consists of $Al_2O_3$.

7. The arrangement of claim 1, 2, 3, 4 or 5 in which said electron emission cathode is a cathode which is heated directly by joulean heat or is heated indirectly.

8. The arrangement of claim 3, wherein the cathode supporting blocks overhang the supporting body and are designed to extend over each other in a form complementary state without contacting each other that if viewed from the other side of the supporting body the supporting body is completely concealed by the blocks.

9. The arrangement of claim 1, 2, 3, 4 or 5, wherein at least one electron-optical control electrode is arranged over the emission cathode.

10. The arrangement of claim 9, wherein said control electrode is designed as a sandwich structure having at least one first layer which faces the cathode and a magnetically excellently conducting second layer facing away from the cathode surface.

11. The arrangement of claim 9, comprising a anode above the cathode said anode being mounted at the contact body via metal connectors.

12. The arrangement of claim 1, 2, 3, 4 or 5, wherein an area including a cathode emission surface of the cathode is separated by a screening, from areas having heating current conductors.

13. The arrangement of claim 1, 2, 3, 4 or 5, wherein the supporting body includes a recess extending around said supporting body for a creeping current between the two sides of the supporting body.

14. The arrangement according to claim 2, 3, 4, or 5, said supporting body being clamped at the one side onto a metal contact body over a large surface area of the contact body and the supporting body.

15. An arrangement according to claim 1, 3, 4 or 5, including at least one quick release device for a rapid mounting of the generator arrangement, located at the one side of said supporting body.

16. The arrangement of claim 15, wherein said quick release device comprises at least one projecting bolt having a radial conical bore, the installation having a receiving bore for said bolt, a radial clamping screw including a conical tip adapted to be driven into said bore, whereby the axis of said screw is off-set relative to the axis of the bore in said bolt when the bolt is inserted and prior to a driving in of the screw so as to clamp the generator arrangement at the installation upon a driving in of the screw via the conical bore at the bolt.

17. The arrangement of claim 7, wherein said cathode comprises an electrode emission surface with a central area and a peripheral area and including two supporting terminals projecting from said peripheral area of said emission surface on one side of said cathode with response to a diameter of said emission surface to allow a free thermal expansion of said emission surface with said cathode being supported mechanically at said two terminals.

18. The arrangement of claim 3, in which the cathode has two terminals and each cathode supporting block includes a locating device for one of the cathode terminals.

19. The arrangement of claim 18, wherein the cathode terminals and the locating devices are structured differently whereby a respective cathode terminal is insertable in only one of the locating devices in order to obtain an error-free inserting of a cathode.

20. The arrangement of claim 18, wherein an abutment member is located at at least one of the locating devices in order to locate the emission cathode in a predetermined position.

21. The arrangement according to claim 7, having an electron emission cathode being directly heated by joulean heat, said cathode comprising an emission body, having at least two spaced conductive terminals for applying an electric current through said emission body for heating said emission body by said joulean heat and said emission body having a slit pattern therein, comprising two helically arranged slits running substantially one beside the other toward a central area of said emission body, defining said emission surface.

22. An indirectly heated electron emission cathode arrangement having a rigid emission surface and a heating device located at a predetermined distance from the emission surface, in which the heating device is a heating current conductor which is heated due to a joulean effect; and the rigid emission surface is rigidly connected to the heating current conductor as a structural unit therewith, the emission surface being a front surface of a pot in which the heating current conductor is located, said front surface being exchangeable.

23. The arrangement of claim 22, wherein a terminal of the heating current conductor is galvanically connected to the emission surface.

24. The arrangement of claim 22, wherein an encapsulated gas is arranged as heat conducting medium between the heating current conductor and the emission surface.

* * * * *